US009711354B2

(12) United States Patent
Jang et al.

(10) Patent No.: US 9,711,354 B2
(45) Date of Patent: Jul. 18, 2017

(54) METHOD OF FABRICATING LIGHT EMITTING DEVICE THROUGH FORMING A TEMPLATE FOR GROWING SEMICONDUCTOR AND SEPARATING GROWTH SUBSTRATE

(71) Applicant: Seoul Viosys Co., Ltd., Ansan-si (KR)

(72) Inventors: Jong Min Jang, Ansan-si (KR); Hee Sub Lee, Ansan-si (KR); Won Young Roh, Ansan-si (KR); Jong Hyeon Chae, Ansan-si (KR); Joon Sup Lee, Ansan-si (KR); Daewoong Suh, Ansan-si (KR); Hyun A Kim, Ansan-si (KR); Seon Min Bae, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 14/578,199

(22) Filed: Dec. 19, 2014

(65) Prior Publication Data

US 2015/0179875 A1    Jun. 25, 2015

(30) Foreign Application Priority Data

Dec. 19, 2013 (KR) .................. 10-2013-0159325

(51) Int. Cl.
| | |
|---|---|
| H01L 21/20 | (2006.01) |
| H01L 21/36 | (2006.01) |
| H01L 21/00 | (2006.01) |
| H01L 21/02 | (2006.01) |
| H01L 33/00 | (2010.01) |
| C30B 25/18 | (2006.01) |
| H01L 33/22 | (2010.01) |

(52) U.S. Cl.
CPC ........ *H01L 21/02647* (2013.01); *C30B 25/18* (2013.01); *H01L 21/0243* (2013.01); *H01L 21/0254* (2013.01); *H01L 21/0265* (2013.01); *H01L 21/02458* (2013.01); *H01L 21/02639* (2013.01); *H01L 21/02645* (2013.01); *H01L 33/0075* (2013.01); *H01L 33/0079* (2013.01); *H01L 33/22* (2013.01); *Y10T 117/10* (2015.01)

(58) Field of Classification Search
CPC ............. H01L 33/0075; H01L 21/0254; H01L 21/0265; H01L 21/02639; H01L 21/02458; H01L 33/0079; H01L 33/22; H01L 21/02647; H01L 21/0243; H01L 21/02389; H01L 21/02645
USPC ....................... 438/481, 44, 46, 478, 341, 42
See application file for complete search history.

(56) References Cited

U.S. PATENT DOCUMENTS 5,676,752 A * 10/1997 Bozler .................... C30B 25/04
117/43
6,627,974 B2 * 9/2003 Kozaki ................... C30B 25/02
257/613

(Continued)

*Primary Examiner* — Shouxiang Hu
(74) *Attorney, Agent, or Firm* — Perkins Coie LLP

(57) ABSTRACT

A template for growing a semiconductor, a method of separating a growth substrate and a method of fabricating a light emitting device using the same are disclosed. The template for growing a semiconductor includes a growth substrate including a nitride substrate; a seed layer disposed on the growth substrate and including at least one trench; and a growth stop layer disposed on a bottom surface of the trench, wherein the trench includes an upper trench and a lower trench, and the upper trench has a smaller width than the lower trench.

13 Claims, 6 Drawing Sheets

(56) References Cited

U.S. PATENT DOCUMENTS

| | | | |
|---|---|---|---|
| 6,939,730 B2* | 9/2005 | Goto | C30B 25/02 |
| | | | 257/E21.108 |
| 2004/0261692 A1* | 12/2004 | Dwilinski | C30B 7/00 |
| | | | 117/84 |
| 2005/0186764 A1* | 8/2005 | Wu | H01L 21/0237 |
| | | | 438/479 |

* cited by examiner

METHOD OF FABRICATING LIGHT EMITTING DEVICE THROUGH FORMING A TEMPLATE FOR GROWING SEMICONDUCTOR AND SEPARATING GROWTH SUBSTRATE

PRIORITY CLAIMS AND CROSS-REFERENCE TO RELATED APPLICATION

This patent document claims priority and benefits of Korean Patent Application No. 10-2013-0159325, filed on Dec. 19, 2013, which is incorporated by reference in its entirety.

TECHNICAL FIELD

The technology disclosed in this patent document relates to a template for growing a semiconductor and a method of separating a growth substrate from the template.

BACKGROUND

A light emitting diode is an inorganic semiconductor light emitting device that emits light through recombination of electrons and holes, and has recently been used in various fields including displays, car lamps, general lighting fixtures, and the like.

Light emitting diodes which are provided as one example of light emitting devices can be classified into vertical type light emitting diodes, lateral type light emitting diodes, and the like depending upon locations of electrodes.

SUMMARY

Examples of implementations of the technology disclosed in this patent document provide a template for growing a semiconductor to which the stress lift-off technique can be applied.

Examples of implementations of the technology disclosed in this patent document provide a method of separating a substrate, by which the substrate is separated from an epitaxial layer grown on the template for growing a semiconductor through the application of stress lift-off.

Examples of implementations of the technology disclosed in this patent document provide a method of fabricating a light emitting device, from which a growth substrate is separated from an epitaxial layer by the substrate separation technique.

In accordance with one aspect of the disclosed technology, a template for growing a semiconductor includes: a growth substrate including a nitride substrate; a seed layer disposed over the growth substrate and including at least one trench; and a growth stop layer disposed over a bottom surface of the trench, wherein the trench includes an upper trench and a lower trench, and the upper trench has a smaller width than the lower trench.

By provision of the template for growing a semiconductor including the trench, a process of growing a semiconductor layer on the template and separating a growth substrate from the template can be easily performed.

The growth stop layer can have a smaller thickness than a height of the lower trench.

The growth stop layer can include $SiN_x$.

The lower trench can have a width of about 4 μm to about 12 μm.

In accordance with another aspect of the disclosed technology, a method of separating a substrate from an epitaxial layer of a template for growing a semiconductor device includes: forming a mask pattern having a masking portion and an opening portion on a growth substrate, the mask pattern including a growth stop layer and an etching layer disposed over the growth stop layer, the growth substrate including a nitride substrate; forming a seed layer over a bottom surface of the opening portion to partially cover an upper surface of the masking portion; forming at least one trench by removing at least a part of the mask pattern such that at least part of the growth stop layer remains on a bottom surface of the trench; forming an epitaxial layer by growing the seed layer as a seed, the forming of the epitaxial layer including forming a void in at least a part of the trench; and separating the growth layer from the epitaxial layer.

As a result, it is possible to minimize damage to the epitaxial layer and the growth substrate in the course of separating the growth substrate from the epitaxial layer.

The seed layer can include a lower seed layer filling the opening portion, and an upper seed layer disposed over the lower seed layer to partially cover an upper side of the masking portion, and the trench can include an upper trench and a lower trench.

The substrate separation method can further include partially etching a lower surface of the upper seed layer exposed by removing the mask pattern, after removing of at least a part of the mask pattern.

The seed layer can include n-type GaN and the lower surface of the upper seed layer can include an N-face.

Partially etching the lower surface of the upper seed layer can include etching the lower surface of the upper seed layer using an etching solution including NaOH or KOH.

In addition, the partially etched lower surface of the upper seed layer can have a roughened surface.

The epitaxial layer can be grown from the upper seed layer through lateral growth and vertical growth to cover an upper portion of the trench.

The forming of the epitaxial layer can include forming a pit at an upper portion of the void.

In addition, removing of at least a part of the mask pattern can include removing the etching layer to expose at least a part of the growth stop layer.

The etching layer can include $SiO_2$ and the etching stop layer can include $SiN_x$.

Further, removing at least a part of the mask pattern can include removing the etching layer using an etching solution including buffered oxide etchant (BOE).

In some embodiments, separation of the growth substrate from the epitaxial layer can include applying stress to an interface between the growth substrate and the epitaxial layer.

The separation of the growth substrate can start from the epitaxial layer at a peripheral region of a lower surface of the lower seed layer.

In accordance with a further embodiment of the disclosed technology, a method of fabricating a light emitting device using a template for growing a semiconductor can include providing a growth substrate; forming masking portions and opening portions that are arranged in a predetermined pattern over the growth substrate; forming a seed layer over the growth substrate to cover a portion of each masking portion; forming a trench to expose an upper surface of the growth substrate with the trench including a lower trench and an upper trench having a smaller width than the lower trench; and forming an epitaxial layer using the seed layers to include a first conductive type semiconductor layer; a second conductive type semiconductor layer, and an active layer disposed between the first and second conductive type semiconductor layers; and separating the growth substrate from the epitaxial layer with the forming of the epitaxial layer including forming a void between the growth substrate and the first conductive type semiconductor layer.

The method of fabricating a light emitting device can further include forming a support substrate on the epitaxial layer before separating of the growth substrate from the epitaxial layer.

After the separating of the growth substrate from the epitaxial layer, a lower surface of the epitaxial layer can include a convex-concave pattern having a profile corresponding to shapes of the void and the seed layer.

The method of fabricating a light emitting device can further include partially removing the lower surface of the epitaxial layer to flatten the convex-concave pattern; and forming a roughened surface on the lower surface of the epitaxial layer.

According to exemplary embodiments, the template for growing a semiconductor allows easy separation of a growth substrate from an epitaxial layer through stress lift-off after growth of an epitaxial layer.

In addition, according to exemplary embodiments, since relatively large voids can be created between the epitaxial layer grown on the template and the growth substrate, the growth substrate can be easily separated from the epitaxial layer by stress lift-off while minimizing damage to the epitaxial layer and the growth substrate.

Further, according to exemplary embodiments, provided is the method of fabricating a light emitting device, from which a growth substrate is separated from an epitaxial layer by the substrate separation method. The method can secure good quality of the fabricated light emitting device while enhancing reliability of the light emitting device.

DETAILED DESCRIPTION

Figure 1:
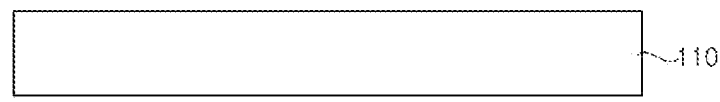
FIG. 1 through FIG. 11 are cross-sectional views illustrating an exemplary template for growing a semiconductor and an exemplary method of separating a substrate according to some implementations of the disclosed technology.

Lateral type light emitting diodes can be fabricated by a relatively simple process, and can be structured to provide a reduced luminous area that is for forming electrodes of a lower semiconductor layer due to partial removal of an active area. In addition, horizontal arrangement of the electrodes causes a undesired condition of current crowding and thus, luminous efficiency of the light emitting diode is reduced. Furthermore, a sapphire substrate that is broadly used as a growth substrate for the lateral type light emitting diodes has low thermal conductivity and thus, heat dissipation of the light emitting diode becomes difficult. As a result, such a lateral type light emitting diode tends to have a relatively high bonding temperature in operation and thus suffers from deterioration in its internal quantum efficiency due to the high temperature.

In order to address such problems of in lateral type light emitting diodes based on the above and other designs, a vertical type light emitting diode or a flip-chip type light emitting diode may be used.

The vertical type light emitting diode and the flip-chip type light emitting diode can be fabricated to have particular structures to address the problems of the lateral type light emitting diode. For example, the vertical type light emitting diode includes electrodes that are disposed at upper and lower portions and the vertical type light emitting diode includes a growth substrate such as a sapphire substrate that is separated from the light emitting diode. The flip-chip type light emitting diode includes electrodes directly adjoining a sub-mount via metal bumps and the like.

Since the vertical type light emitting diode has a vertical arrangement of the electrodes, a process of separating the growth substrate from the electrodes needs to be performed. The flip-chip type light emitting diode also requires the process of separating the growth substrate in order to improve the luminous efficiency. Various separation techniques have been developed to separate the growth substrate. While a laser lift-off (LLO) technique is generally used for separating the growth substrate, a chemical lift-off (CLO) technique or a stress lift-off (SLO) technique, etc., have been also studied and developed in the art.

For the laser lift-off technique which uses laser light having high intensity, high intensity of laser light causes generation of cracks on a semiconductor layer. Further, due to a small difference in energy band-gap between the growth substrate and the semiconductor layer, high intensity of laser light makes the laser lift-off technique difficult to be applied when separating a growth substrate formed of a homogeneous material from the semiconductor layer such as a gallium nitride semiconductor layer or a gallium nitride substrate. The chemical lift-off technique provides irregular process yield due to low process reproducibility in the course of chemical etching of an interface between the substrate and the semiconductor layer. Further, since long time is required for the chemical etching, the chemical lift-off technique deteriorates overall process capability in the fabrication of the light emitting diode.

In order to address such disadvantages of the laser lift-off technique and the chemical lift-off technique, the stress lift-off technique has been studied in various manners. For the stress lift-off technique, since the stress is applied to an interface between the growth substrate and the epitaxial layer, an epitaxial layer having a thickness of several to dozens of micrometers is also separated from the growth substrate.

It can be difficult to use the stress lift-off technique for mass production. This is because the stress applied for separating the epitaxial layer from the growth substrate is also applied to the epitaxial layer and generates strain and cracks in the epitaxial layer. As a result, the epitaxial layer separated from the growth substrate has reduced crystallinity, which causes deterioration in light intensity and reliability of a light emitting device fabricated using the epitaxial layer. In addition, since it is difficult to estimate an accurate damaged portion and an accurate degree of damage to the epitaxial layer, the stress lift-off technique may negatively influence on reliability and yield of the process. Moreover, since the stress applied for separating the growth substrate is also transferred to the growth substrate, it is not desirable for the separation of a brittle and expensive growth substrate such as a gallium nitride substrate.

The examples of implementations of the disclosed technology provide a template for growing a semiconductor layer and a method of separating a growth substrate, which can secure high process capability and high yield in order to achieve mass production. In addition, some implementations of the disclosed technology provide semiconductor devices, for example, light emitting devices, by using the separation technique of a growth substrate from an epitaxial layer while applying the stress lift-off technique.

Hereinafter, exemplary implementations of the disclosed technology will be described in detail with reference to the accompanying drawings. It should be understood that the following implementations are provided to facilitate understanding of examples of the disclosed technology. Thus, it should be understood that the disclosed technology is not limited to the following implementations and can be provided in different ways. In addition, it should be noted that the drawings are not to precise scale and some of the dimensions, such as width, length, thickness, and the like, can be exaggerated for convenience of description. It will be understood that when an element such as a layer, film, region or substrate is referred to as being formed, placed or disposed "above" or "on" another element, it can be directly formed, placed or disposed on the other element or intervening elements can also be present. Like components will be denoted by like reference numerals throughout the specification.

FIGS. 1 through 11 are cross-sectional views illustrating an exemplary template for growing a semiconductor and an exemplary method of separating a substrate according to some implementations of the disclosed technology.

In the following exemplary implementations, a method of fabricating a template for growing a semiconductor and a method of separating a substrate are described as separate processes. However, the method of fabricating a template for growing a semiconductor and a method of separating a substrate can be practiced together. Further, a method of fabricating a template for growing a semiconductor and a method of separating a substrate can be employed to provide a method of fabricating a light emitting device.

Referring to FIG. 1, a growth substrate 110 is prepared.

The growth substrate 110 can include any substrate that enables the growth of an epitaxial layer 130. For example, the growth substrate 110 can include a sapphire substrate, a silicon substrate, a SiC substrate, a spinel substrate, or a nitride substrate, and the like. In some implementations, the growth substrate 110 can be or include a gallium nitride substrate.

In addition, the growth substrate 110 can include various growth faces or planes. For example, the growth substrate 110 can include a polar growth plane such as a c-plane ((0001) plane), a non-polar growth plane such as an m-plane ((1-100) plane) or an a-plane ((11-20) plane), or a semi-polar growth plane such as a (20-21) plane.

When the growth substrate 110 demonstrates heterogeneous characteristics with respect to the epitaxial layer 130 (see FIGS. 6, 7, 8, 9a and 9b), a buffer layer (not shown) can be formed on the growth substrate 110. For example, the buffer layer is formed when the epitaxial layer 130 (see FIGS. 6, 7, 8, 9a and 9b) includes a nitride semiconductor and the growth substrate 110 is a heterogeneous substrate such as a sapphire substrate.

Figure 2:
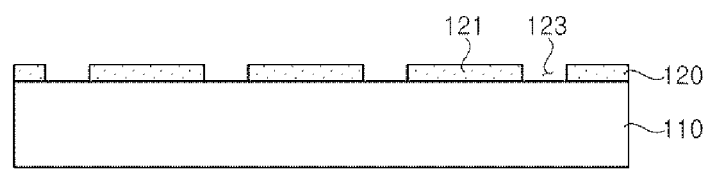

Referring to FIG. 2, a mask pattern 120 is formed on the growth substrate 110.

The mask pattern 120 can include one or more masking portions 121 and one or more opening portions 123. An upper surface of the growth substrate 110 can be partially exposed through the opening portion 123. When the buffer layer (not shown) is formed on the growth substrate 110, an upper surface of the buffer layer can be partially exposed through the opening portion 123.

The mask pattern 120 can be formed in a predetermined pattern depending upon the arrangement of the masking portions 121 and the opening portions 123. For example, the mask pattern 120 can have at least one pattern including a stripe pattern, an island pattern, or a mesh pattern.

In addition, a region for forming a void 140 (see FIGS. 5, 6, and 7) can be defined depending upon a location of each of the masking portions 121 in the mask pattern 120. Thus, the masking portions 121 and the opening portions 123 of the mask pattern 120 can be determined depending upon the size of the voids 140 and a distance between the voids 140 (see FIGS. 5, 6, and 7). Furthermore, in the mask pattern 120, the width of the masking portion 121 can be determined in consideration of lateral growth of first conductive type semiconductor layers 131 (see FIG. 5) which are grown and merge with each other. For example, the masking portion 121 can have a width of about 4 µm to about 12 µm, and the opening portion 123 can have a width of about 0.5 µm to about 5 µm. However, other implementations are also possible regarding the size of the masking portions 121 and the opening portions 123.

The mask pattern 120 can include an insulating material such as $SiO_2$ or $SiN_x$, and can be formed to have a predetermined pattern by a deposition process such as an e-beam evaporation and photolithographic etching. However, it should be understood that the disclosed technology are not limited thereto. Thus, the mask pattern can be formed by other deposition techniques and lift-off techniques. In some implementations, the mask pattern 120 can be formed of or include $SiO_2$.

Figure 3:
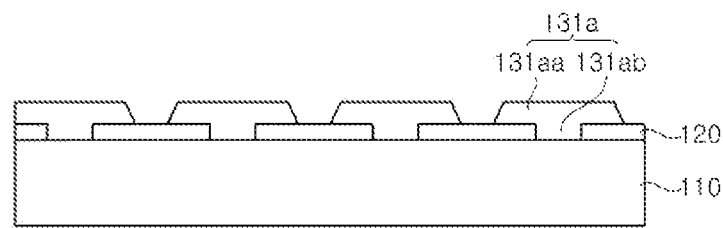

Referring to FIG. 3, a seed layer 131a is formed on or over the growth substrate 110 and the mask pattern 120.

The seed layer 131a is grown from a bottom surface of the opening portion 123 and can at least partially cover an upper surface of the masking portion 121. Accordingly, the seed layer 131a can cover the opening portion 123 and the upper surface of the masking portion 121 can be at least partially exposed. In addition, the seed layer 131a can include a lower seed layer 131ab filling the opening portion 123. Further, an upper seed layer 131aa is disposed on the lower seed layer 131ab and partially covers the masking portion 121. The upper seed layer 131aa can have a greater width than the lower seed layer 131ab.

The seed layer 131a can include a nitride semiconductor such as (Al, Ga, In)N, and can be doped with p-type or n-type impurities. Furthermore, the seed layer 131a can be doped to have the same type conductivity as that of the first conductive type semiconductor layer 131. For example, the seed layer 131a can include n-type GaN including impurities such as Si.

The seed layer 131a can be grown from the surface of the growth substrate 110 on the bottom surface of the opening portion 123 by, for example, metal organic chemical vapor deposition (MOCVD). The seed layer 131a can be grown by an epitaxial lateral overgrowth. As a result, the seed layer 131a can be grown through both vertical growth and lateral growth, and the upper seed layer 131aa can cover the upper surface of the masking portion 121 in the course of lateral growth. The growth degree of the seed layer 131a can be adjusted to control an area of the masking portion 121 covered by the seed layer 131a. For example, the seed layer 131a can be grown to cover 10% or more of an upper surface area of the masking portion 121.

A side surface of the upper seed layer 131aa can be grown along a certain crystal plane, and the upper seed layer 131aa can have an inclined side surface according to the inclination of the crystal plane.

Figure 4A:
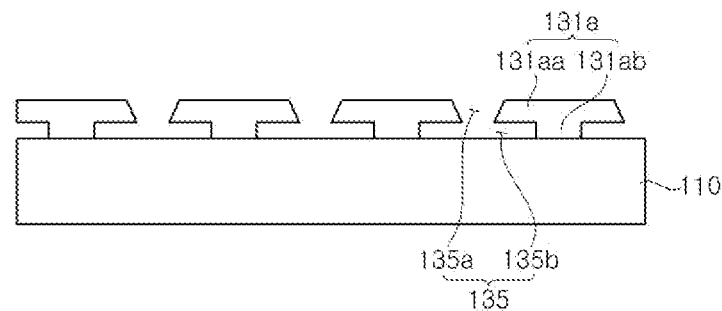

Next, referring to FIG. 4a, at least one trench 135 is formed by removing at least part of the mask pattern 120. As a result, a template for growing a semiconductor layer as shown in FIG. 4a can be provided.

The mask pattern 120 can be removed by wet etching. In addition, the entirety of the mask pattern 120 can be removed, thereby forming the trench 135 through which the upper surface of the growth substrate 110 is exposed at a lower side of the trench 135. For example, the mask pattern 120 including $SiO_2$ can be removed using an etching solution containing or including a buffered oxide etchant (BOE) or HF.

The trench 135 can include an upper trench 135a placed between adjacent upper seed layers 131aa and a lower trench 135b placed between adjacent lower seed layers 131ab. The upper trench 135a can have a smaller width than the lower trench 135b. In addition, since the trenches 135 can be formed in a region from which the masking portion 121 of the mask pattern 120 is removed, a pattern of the trench 135 can be determined depending upon the arrangement of the mask pattern 120. In one implementation, the plurality of trenches 135 can have at least one pattern including a stripe pattern, an island pattern, or a mesh pattern.

Since the lower trench 135b can be formed in a region from which the mask pattern 120 is removed, the lower trench 135b can have substantially the same width as the width of the mask pattern 120. In some implementations, the lower trench 135b can have a width of about 4 μm to about 12 μm.

The template for growing a semiconductor layer as provided in some implementations of the disclosed technology includes the growth substrate 110 and the seed layer 131a including the trenches 135. Each of the trenches 135 includes the upper trench 135a and the lower trench 135b, and the upper trench 135a can have a smaller width than the lower trench 135a.

Figure 4B:
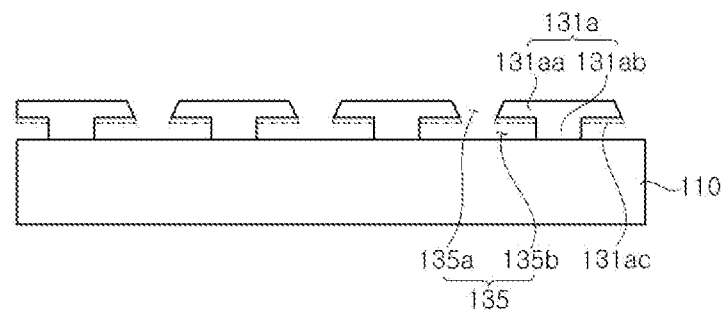

As shown in FIG. 4b, the fabrication process of the template for growing a semiconductor can further include partially removing a lower surface of the upper seed layer 131aa. Thus, according to some implementations of the disclosed technology, a portion 131ac of the seed layer 131aa is removed after removing the mask pattern 120. As a result, the size of the void 140 (see FIGS. 5, 6 and 7) formed in the course of forming an epitaxial layer 130 (see FIGS. 6, 7, 8, 9a and 9b) in the following process can be greater in FIG. 4b than in FIG. 4a. Accordingly, the growth substrate 110 can be more easily removed from the epitaxial layer 130 (see FIGS. 6, 7, 8, 9a and 9b).

The portion 131ac of the seed layer 131aa can be removed by a wet etching in consideration of a crystal direction of the seed layer 131a and the like.

For example, when the upper seed layer 131aa includes n-type GaN and has a growth plane including a c-plane, the lower surface of the upper seed layer 131aa includes an N-face. Thus, the lower portion 131ac of the seed layer 131aa can be removed by a wet etching of the lower surface of the upper seed layer 131aa including the N-face, The wet etching can be performed using an etching solution containing or including NaOH or KOH. Here, since the upper surface of the upper seed layer 131aa includes a Ga-face, the upper surface of the upper seed layer 131aa is not substantially etched by the etching solution. Further, the partially removed lower surface of the upper seed layer 131aa can be roughened by the etching solution. In a light emitting device fabricated according to exemplary embodiments, the lower surface of the upper seed layer 131aa can act as a light emitting face, whereby the light emitting face has increased roughness to enhance light extraction efficiency.

In the following exemplary embodiments, a method of separating a substrate using the template for growing a semiconductor layer as shown in FIG. 4a and a method of fabricating a light emitting device will be described.

Figure 5:
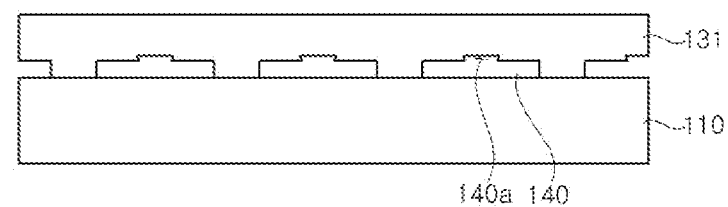
Figure 6:
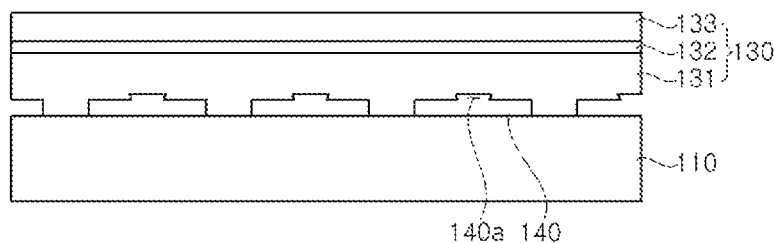

Referring to FIG. 5 and FIG. 6, the epitaxial layer 130 (see also FIGS. 7, 8, 9a and 9b) is formed using the seed layer 131a as a seed. The epitaxial layer 130 (see FIGS. 6, 7, 8, 9a and 9b) can include a first conductive type semiconductor layer 131, an active layer 132, and a second conductive type semiconductor layer 133.

Referring to FIG. 5, the first conductive type semiconductor layer 131 can be formed using the seed layer 131a, for example, the upper seed layer 131aa, as a seed.

The first conductive type semiconductor layer 131 can include a nitride semiconductor such as (Al, Ga, In)N and can be formed by MOCVD, MBE, or HVPE, and the like. The first conductive type semiconductor layer 131 can be doped with n-type impurities such as Si to have n-type conductivity. In addition, the seed layer 131a and the first conductive type semiconductor layer 131 can have the same type of conductivity, and can include the same material. For example, each of the seed layer 131a and the first conductive type semiconductor layer 131 can include n-type GaN.

Alternatively, the first conductive type semiconductor layer 131 can include an undoped layer and a doped layer. In the formation of the first conductive type semiconductor layer 131, the undoped layer is first grown and then the doped layer is grown. In this case, the first conductive type semiconductor layer 131 can include multiple layers. By firstly growing the undoped layer in the formation of the first conductive type semiconductor layer 131, crystallinity of the first conductive type semiconductor layer 131 can be improved.

The first conductive type semiconductor layer 131 can be grown using the upper seed layer 131aa of the seed layer 131a as a seed through both lateral growth and vertical growth. That is, the first conductive type semiconductor layer 131 can be formed through an epitaxial lateral growth. In this case, a first conductive type semiconductor layer 131 grown from one seed layer 131a merges with another first conductive type semiconductor layer 131 grown from an adjacent seed layer 131a to form a single continuous first conductive type semiconductor layer 131.

Depending on growth conditions, the first conductive type semiconductor layer 131 can be continuously or discontinuously grown. For example, assume that the first conductive type semiconductor layer 131 is initially grown under the 2D growth condition under which lateral growth is dominant, merges with adjacent first conductive type semiconductor layers 131 grown on adjacent seed layers 131a, and then is subject to the change of the growth condition. After the change of the growth condition, in one example, the first conductive type semiconductor layer 131 is grown under the 3D growth condition under which vertical growth is dominant. In the formation of the first conductive type semiconductor layer 131 by MOCVD, the first conductive type semiconductor layer 131 can be formed by changing the growth condition from the 2D growth condition to the 3D growth condition. Such change of the growth condition could be performed by adjusting growth temperature, growth pressure, or V/III ratio. Here, the 3D growth condition can be achieved by a lower growth temperature, a higher growth pressure and a higher V/III ratio, and the 2D growth condition can be achieved by a higher growth temperature, a lower growth pressure, and a lower V/III ratio.

Accordingly, the first conductive type semiconductor layer 131 is grown to merge with another first conductive type semiconductor layer 131 and cover the trenches 135. As the first conductive type semiconductor layer 131 is formed, the trenches 135 form voids 140. Thus, the voids 140 can be placed between the growth substrate 110 and the first conductive type semiconductor layer 131.

In some implementations, when the first conductive type semiconductor layers 131 merges with each other at upper portions of side surfaces of the upper seed layers 131aa during the growth of the first conductive type semiconductor layers 131, the growth of the first conductive type semiconductor layers 131 towards lower portions of the side surfaces of the upper seed layers 131aa can be stopped. In this case, the first conductive type semiconductor layers 131 do not merge with each other at the lower portions of adjacent upper seed layers 131aa to form a growth stop zone. As a result, the growth stop zone can form a pit 140a at lower portions of the first conductive type semiconductor layers 131 by stopping the growth of the first conductive type semiconductor layers 131 while leaving the first conductive type semiconductor layers 131 not to merge with each other. In this case, the void 140 (see FIGS. 5, 6 and 7) can include the pit 140a placed at an upper portion of the void 140 (see FIGS. 5, 6 and 7).

As the void 140 (see FIGS. 5, 6 and 7) includes the pit 140a at the upper portion of the void 140 (see FIGS. 5, 6 and 7), the size of the void 140 (see FIGS. 5, 6 and 7) can be further increased, thereby enabling easier separation of the growth substrate from the epitaxial layer in a process described below.

Then, referring to FIG. 6, the epitaxial layer 130 (see FIGS. 6, 7, 8, 9a and 9b) can be formed by growing the active layer 132 and the second conductive type semiconductor layer 133 on the first conductive type semiconductor layer 131.

The active layer 132 can include a nitride semiconductor such as (Al, Ga, In)N and can be grown on the first conductive type semiconductor layer 131 by MOCVD, MBE, or HYPE, and the like. In addition, the active layer 132 can include a multi-quantum well (MQW) structure. Elements and compositions of semiconductor layers forming the multi-quantum well structure can be adjusted to allow the semiconductor layers forming the multi-quantum well structure to emit light having desired peak wavelengths.

The second conductive type semiconductor layer 133 can include a nitride semiconductor such as (Al, Ga, In)N and can be grown on the active layer 132 by MOCVD, MBE, or HVPE, and the like. The second conductive type semiconductor layer 133 can be doped with p-type impurities such as Mg to have p-type conductivity, which is opposite to the conductive type of the first conductive type semiconductor layer 131. Although it has been described that the first and second conductive type semiconductor layers 131 and 133 have the n-type and p-type impurities, respectively, other implementations are also possible.

Herein, detailed description of the semiconductor layers 131, 133, and 135 including nitride semiconductors will be omitted.

Figure 7:
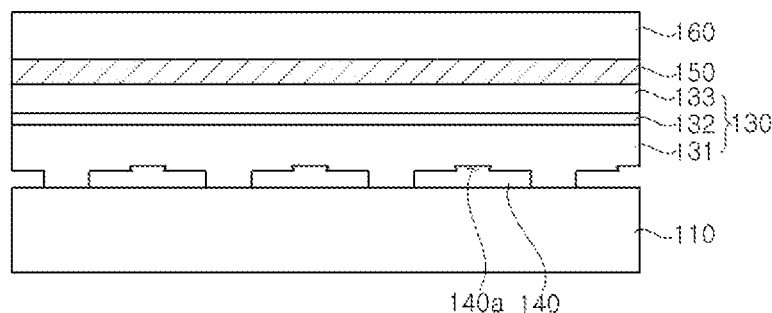

Referring to FIG. 7, a support substrate 160 can be formed over an the epitaxial layer 130. For example, the support substrate 160 can be bonded to the upper side of the epitaxial layer 130. In addition, the method of separating a substrate and the method of fabricating a light emitting device according to exemplary embodiments can further include forming a bonding layer 150 which bonds the support substrate 160 to the epitaxial layer 130.

The support substrate 160 can be or include an insulating substrate, a conductive substrate, or a circuit substrate. For example, the support substrate 160 can be or include a sapphire substrate, a nitride substrate, a glass substrate, a SiC substrate, a silicon substrate, a metal substrate, a ceramic substrate, or a PCB substrate. As one example of the disclosed technology, the support substrate 160 can include a metal. The support substrate 160 can have a multilayer structure, for example, a multilayer structure in which a Mo layer is formed between an upper Cu layer and a lower Cu layer.

The process of bonding the support substrate 160 to the epitaxial layer 130 can include eutectic bonding of the support substrate 160. For example, the support substrate 160 can be bonded to the epitaxial layer 130 by eutectic bonding using AuSn. Thus, the bonding layer 150 can include AuSn. Eutectic bonding using AuSn can be performed by processes including heating AuSn to a eutectic temperature of AuSn (about 280° C.) or more (for example, about 350° C.), placing the heated AuSn between the epitaxial layer 130 and the support substrate 160, and cooling the AuSn.

The method of separating a growth substrate from an epitaxial layer and the method of fabricating a light emitting device can further include forming a metal layer (not shown) on the epitaxial layer 130 before forming the support substrate 160.

The metal layer (not shown) can include a reflective metal layer and a barrier metal layer, which can be formed to cover the reflective metal layer. The metal layer can be formed by suitable deposition and lift-off techniques.

The reflective metal layer serves to reflect light and can also act as an electrode electrically connected to the epitaxial layer 130. Thus, the reflective metal layer can include a material having high reflectivity and capable of forming ohmic contact. The reflective metal layer can include at least one of, for example, Ni, Pt, Pd, Rh, W, Ti, Al, Ag or Au. In addition, the barrier metal layer prevents interdiffusion between the reflective metal layer and other materials. As a result, it is possible to prevent increase in contact resistance and decrease in reflectivity which are caused by damage to the reflective metal layer. The barrier metal layer can include at least one of Ni, Cr, or Ti, and can have a multilayer structure.

In addition, the method of separating a substrate and the method of fabricating a light emitting device according to exemplary embodiments of the disclosed technology can include bonding a carrier substrate (not shown) to a growth substrate 110. For example, the carrier substrate having low brittleness and/or elongation is bonded to a lower surface of the growth substrate 110. The carrier substrate bonded to the lower surface of the growth substrate 110 can prevent fracture of the growth substrate 110 in the course of separating the growth substrate from the epitaxial layer 130. For example, when the growth substrate 110 is expensive and highly brittle (such as a gallium nitride substrate), a relatively inexpensive substrate (for example, a glass substrate, or a sapphire substrate, and the like) is attached to the lower surface of the growth substrate 110. Accordingly, the carrier substrate can support the growth substrate 110 and prevent damage or fracture of the growth substrate 110.

Figure 8:
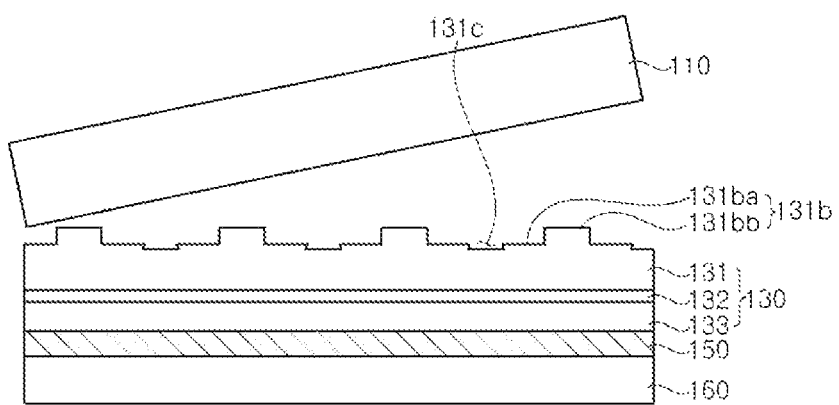

Next, referring to FIG. 8, the growth substrate 110 is separated from the epitaxial layer 130. At this time, the separation of the growth substrate 110 from the epitaxial layer 130 can start at a peripheral region of the void 140 (see FIGS. 5, 6, and 7).

The separation of the growth substrate 110 from the epitaxial layer 130 can include applying stress to an interface between the epitaxial layer 130 and the growth substrate 110. That is, the epitaxial layer 130 and the growth substrate 110 can be separated from each other by the stress lift-off technique. Accordingly, separation of the growth substrate 110 from the epitaxial layer 130 can occur at the peripheral region of the void 140 (see FIGS. 5, 6, and 7), for example, around a boundary between the epitaxial layer 130 and the growth substrate 110. The epitaxial layer 130 and the growth substrate 110 are bonded to each other in a relatively narrow area, and the stress applied for the separation of the growth substrate is concentrated in this area. Thus, the growth substrate 110 can be separated from the epitaxial layer 130.

Further, since the voids 140 have a greater size than the voids provided according to other methods than the disclosed technology, the growth substrate 110 can be easily separated from the epitaxial layer 130 by applying relatively low level of stress. Accordingly, since the growth substrate 110 can be more easily separated from the epitaxial layer 130, it is possible to minimize damages to the epitaxial layer 130 and/or the growth substrate 110 which is caused by the applied stress in the course of separating the substrate. Furthermore, the separated growth substrate 110 is prevented from cracking and thus can be reused. Reusing the expensive growth substrate 110 such as a gallium nitride substrate can result in a reduction in process costs for manufacturing semiconductor devices.

Figure 9A:
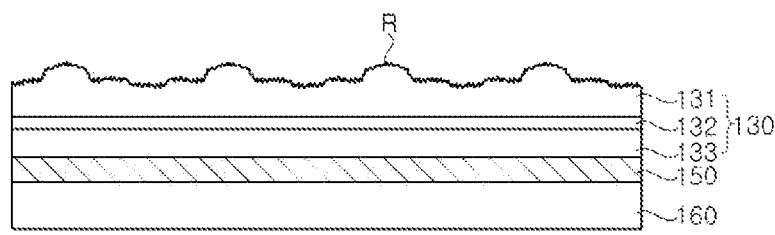

Next, referring to FIG. 9a, a roughened surface R is formed on a surface of the first conductive type semiconductor layer 131 exposed by the separation of the growth substrate 110 from the epitaxial layer 130. In addition, before the formation of the roughened surface R, residues on the surface of the first conductive type semiconductor layer 131 can be removed by a chemical or physical process, and the surface of the first conductive type semiconductor layer 131 can be removed to a predetermined thickness. Here, the removal of the surface of the first conductive type semiconductor layer 131 to a predetermined thickness can be performed by, for example, dry etching.

The surface of the first conductive type semiconductor layer 131 exposed by the separation of the growth substrate 110 from the epitaxial layer 130 can include a predetermined convex-concave pattern. The convex-concave pattern can depend upon the shapes of the voids 140 and the seed layer 131a. Accordingly, the convex-concave pattern can have a surface profile corresponding to the shapes of the voids 140 and the seed layer 131a. In addition, upon removing the surface of the first conductive type semiconductor layer 131 by a dry etching, the convex-concave pattern on the surface of the first conductive type semiconductor layer 131 becomes smooth, as shown in FIG. 9a.

Since the first conductive type semiconductor layer 131 is also grown from the upper seed layer 131aa through lateral growth, a region around a separation plane of the first conductive type semiconductor layer 131 may have reduced crystallinity. Further, defects or damage can occur in the region around the separation plane of the first conductive type semiconductor layer 131 in the course of separating the growth substrate 110. Thus, average crystallinity of the overall first conductive type semiconductor layer 131 can be improved by removing the surface of the first conductive type semiconductor layer 131 to a predetermined thickness.

The roughened surface R can be formed by wet etching using a KOH and/or NaOH solution, or a sulfuric-phosphoric acid solution, or can be formed by photo-enhanced chemical (PEC) etching. The roughened surface R formed on the surface of the first conductive type semiconductor layer 131 can improve light extraction efficiency.

Figure 9B:
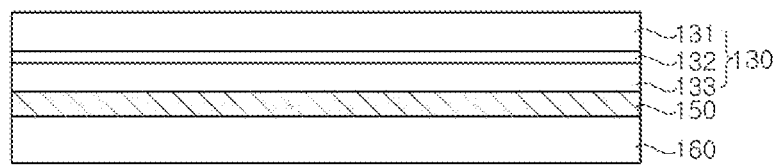

Alternatively, as shown in FIG. 9b, the surface of the first conductive type semiconductor layer 131 exposed by the separation of the growth substrate 110 can be flattened. Flattening of the exposed surface of the first conductive type semiconductor layer 131 can be performed by various processes including a chemical or mechanical process. For example, physical or chemical methods such as dry or wet etching, lapping, polishing, or chemical mechanical polishing (CMP) can be used. Flattening of the exposed surface of the first conductive type semiconductor layer 131 can facilitate a subsequent process.

Figure 10:
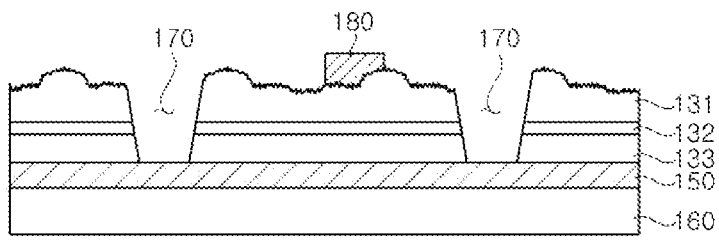

Next, referring to FIG. 10, a device isolation region 170 can be formed by patterning the epitaxial layer 130, and a first electrode 180 can be formed in each device region.

The patterning can be performed by dry etching. The bonding layer 150 can be partially exposed by the device isolation region 170, and the epitaxial layer 130 can be divided to form at least one device region.

Figure 11:
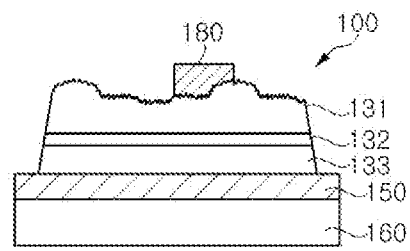

Referring to FIG. 11, the bonding layer 150 and the support substrate 160 under the device isolation region 170 are divided. As a result, at least one light emitting device 100 can be provided.

In the exemplary implementations described with reference to the drawings, the roughened surface R is also formed in a region in which an electrode 180 will be formed. Alternatively, the roughened surface R can be omitted in the region of the electrode 180, when the electrode 180 is formed on the surface of the first conductive type semiconductor layer 131.

In some implementations, before forming the roughened surface R by increasing surface roughness of the first conductive type semiconductor layer 131, an electrode formation region in which the electrode 180 will be formed is defined to form an etching mask pattern in the electrode formation region. The etching mask pattern can include, for example, SiO$_2$. Then, the surface roughness of the first conductive type semiconductor layer 131 is increased by wet etching. At this time, since a region having the etching mask pattern is not etched, the roughened surface R cannot be formed on the region. Next, after the etching mask pattern is removed and the device isolation region 170 is formed by patterning the epitaxial layer 130, the electrode 180 can be formed in the region in which the roughened surface R is not formed.

Although this exemplary implementation provides a vertical type light emitting device in which electrodes are disposed at upper and lower portions of the semiconductor layers, it should be understood that the disclosed technology is not limited thereto. For example, exemplary implementations of the disclosed technology can also be applied to the separation of a growth substrate of a flip-chip type light emitting device or a hybrid type light emitting device in which a vertical type and a flip-chip type are combined.

FIGS. 12 through 16 are cross-sectional views illustrating a template for growing a semiconductor layer and a method of separating a substrate, according to other exemplary implementations of the disclosed technology.

The exemplary implementations of FIGS. 12 through 16 are generally similar to the implementations described with reference to FIGS. 1 through 11 and have a difference in terms of a mask pattern. The differences of the implementations as shown in FIGS. 12 through 16 from those in FIGS. 1 through 11 will be mainly described, and detailed descriptions of the common features will be omitted.

Figure 12:
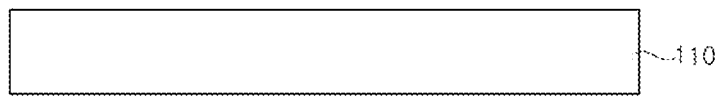
FIG. 12 through FIG. 16 are cross-sectional views illustrating an exemplary template for growing a semiconductor and an exemplary method of separating a substrate according to some implementations of the disclosed technology.

Referring to FIG. 12, a growth substrate 110 is prepared.

Figure 13:
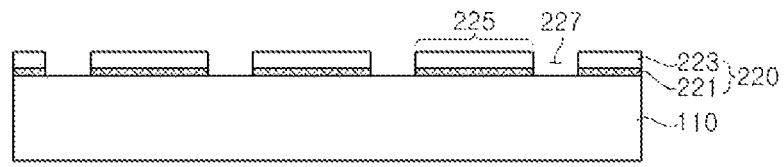

Referring to FIG. 13, a mask pattern 220 is formed on the growth substrate 110.

As in FIGS. 1 through 11, the mask pattern 220 can include a masking portion 225 and an opening portion 227, through which an upper surface of the growth substrate 110 can be partially exposed. In the present implementation, the mask pattern 220 includes a growth stop layer 221 and an etching layer 223 disposed on the growth stop layer 221.

The etching layer 223 can be subjected to etching to provide a region for forming voids 240. The growth stop layer 221 can prevent the epitaxial layer from growing in a region of the growth substrate 110 under the masking portion 225 of the mask pattern 220. This process will be described below in detail.

The etching layer 223 and the growth stop layer 221 can include different materials. In one implementation, the etching layer 223 and the growth stop layer 221 include materials exhibiting different etching rates with respect to a specific etchant. For example, the etching layer 223 can include $SiO_2$ and the growth stop layer 221 can include $SiN_x$. Thicknesses of the etching layer 223 and the growth stop layer 221 are not limited to a particular value and can be adjusted in consideration of crystallinity of the epitaxial layer 130 or the size of the voids 240, and the like. In addition, the growth stop layer 221 and the etching layer 223 can be formed by various methods.

In some implementations, the mask pattern 220 can be formed by forming a layer including SiNx to a thickness of about 100 nm on the growth substrate 110 by, for example, a deposition process such as e-beam evaporation, forming a layer including $SiO_2$ to a thickness of about 500 nm on the layer including SiNx by, for example, a deposition process, and forming the opening portion 227 by, for example, photolithography and etching.

Figure 14:
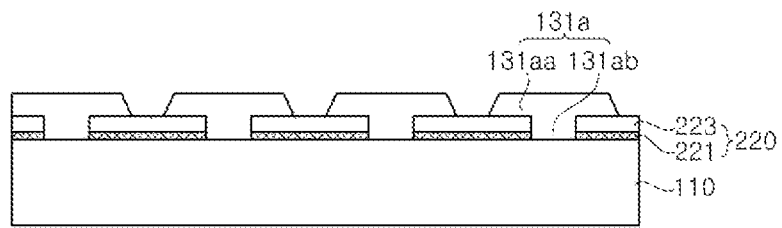

Referring to FIG. 14, a seed layer 131a is formed on the growth substrate 110 such that a part of an upper surface of the masking portion 225 can be covered by the seed layer 131a.

Figure 15:
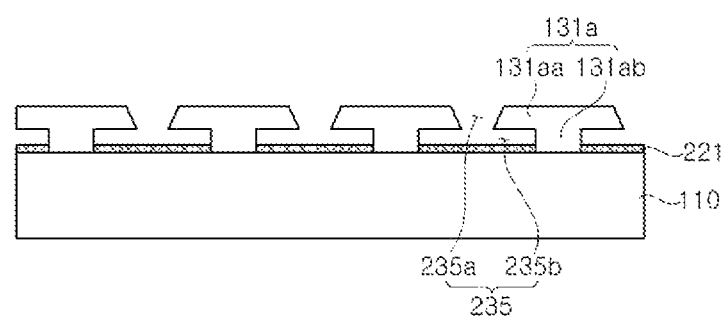

Referring to FIG. 15, at least one trench 235 is formed by partially removing the mask pattern 220. As a result, a template for growing a semiconductor can be provided as shown in FIG. 15.

Partial removal of the mask pattern 220 can include at least partially removing the etching layer 223 of the mask pattern 220 to expose at least a portion of the growth stop layer 221. That is, according to exemplary implementations, the mask pattern 220 can be partially removed such that at least a part of the etching layer 223 is removed from an upper portion of the mask patter 220 and at least a part of the growth stop layer 221 remains at a lower portion of the mask pattern 220. As a result, at least a part of an upper surface of the growth stop layer 221 can be exposed through a bottom surface of a lower trench 235b. In some implementations, the thickness of the growth stop layer 221 can be smaller than a height of the lower trench 235b.

Partial removal of the mask pattern 220 can be achieved by removing the etching layer 223 through wet etching or the like while stopping an etching process before the removal of the growth stop layer 221. At this time, an etching rate with respect to the etching layer 223 can be higher than the etching rate with respect to the growth stop layer 221. For example, when the etching layer 223 and the growth stop layer 221 include $SiO_2$ and $SiN_x$, respectively, the mask pattern 220 can be partially removed using an etching solution containing or including BOE. Since an etching rate of $SiO_2$ to $SiN_x$ with respect to BOE is about 5:1, $SiN_x$ has a much lower etching degree than $SiO_2$. Thus, in the course of partially removing the mask pattern 220, the growth stop layer 221 can also act as an etching stop layer.

Figure 16:
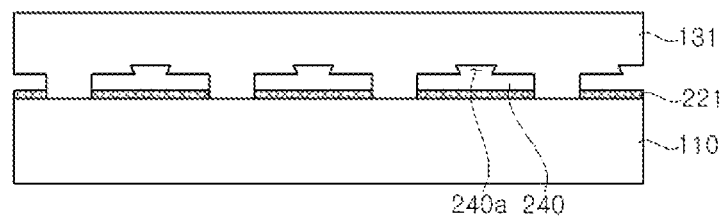

Referring to FIG. 16, a first conductive type semiconductor layer 131 is formed using the seed layer 131a as a seed. As the first conductive type semiconductor layer 131 is formed, the trench 235 forms a void 240.

When the growth substrate 110 is exposed through the bottom surface of the trench 235, a semiconductor layer can be grown from the exposed surface of the growth substrate 110 during the growth of the first conductive type semiconductor layer 131. According to the exemplary implementations, however, the growth stop layer 221 is formed on the bottom surface of the trench 235 and thus, the semiconductor layer is not grown from the bottom surface of the trench 235. Accordingly, it is possible to prevent reduction of the void 240 in terms of the size due to growth of the semiconductor layer from the bottom surface of the trench 235.

In some implementation, when the growth substrate 110 is a homogeneous substrate such as a gallium nitride substrate instead of a heterogeneous substrate such as a sapphire substrate, there are high possibilities that the semiconductor layer is grown from the bottom surface of the trench 235 in the course of growing the first conductive type semiconductor layer 131. Accordingly, in the exemplary implementations in which the mask pattern 220 including the growth stop layer 221 is used, the growth of the semiconductor layer on the bottom of the trench 235 can be prevented even when the growth substrate 110 is a homogeneous substrate. Thus, for the homogeneous substrate, the implementation of the disclosed technology can be more effectively used to prevent the reduction of the void 240 in terms of the size.

The subsequent processes are generally similar to those described with reference to FIGS. 6 through 11, and thus detailed descriptions thereof will be omitted.

Only a few embodiments, implementations and examples are described and other embodiments and implementations, and various enhancements and variations can be made based on what is described and illustrated in this document.

What is claimed is:

1. A method of separating a substrate from an epitaxial layer of a template for growing a semiconductor device, the method comprising:
    forming a mask pattern having a masking portion and an opening portion over a growth substrate, the mask pattern including a growth stop layer and an etching layer disposed over the growth stop layer and the growth substrate including a nitride substrate;
    forming a seed layer over a bottom surface of the opening portion to include a lower seed layer disposed in the opening portion and an upper seed layer disposed over the lower seed layer and partially covering an upper surface of the masking portion;
    forming at least one trench by removing the etching layer such that the growth stop layer remains on at least a portion of a bottom surface of the trench;
    after forming of the at least one trench, increasing a size of the trench by removing a portion of the upper seed layer;
    forming an epitaxial layer by growing the seed layer as a seed, the forming of the epitaxial layer including forming a void in at least a part of the trench; and
    separating the growth substrate from the epitaxial layer.

2. The method of separating a substrate of claim 1, wherein the trench includes an upper trench and a lower trench.

3. The method of separating a substrate of claim 2, wherein the removing of the portion of the upper seed layer includes partially etching a lower surface of the upper seed layer that defines the lower trench together with a side of the lower seed layer.

4. The method of separating a substrate of claim 3, wherein the seed layer includes n-type GaN, and a lower surface of the upper seed layer includes an N-face.

5. The method of separating a substrate of claim 4, wherein the partial etching of the lower surface of the upper seed layer includes etching the lower surface of the upper seed layer using an etching solution including NaOH or KOH.

6. The method of separating a substrate of claim 5, wherein the partially etched lower surface of the upper seed layer has a roughened surface.

7. The method of separating a substrate of claim 2, wherein the epitaxial layer is grown from the upper seed layer through lateral growth and vertical growth to cover an upper portion of the trench.

8. The method of separating a substrate of claim 7, wherein the forming of the epitaxial layer further including forming a pit at an upper portion of the void.

9. The method of separating a substrate of claim 1, wherein the step of removing the etching layer exposes at least a part of the growth stop layer.

10. The method of separating a substrate of claim 1, wherein the etching layer includes $SiO_2$ and the etching stop layer includes $SiN_x$.

11. The method of separating a substrate of claim 10, wherein the step of removing the etching layer uses an etching solution including buffered oxide etchant (BOE).

12. The method of separating a substrate of claim 1, wherein the separating of the growth substrate includes applying stress to an interface between the growth substrate and the epitaxial layer.

13. The method of separating a substrate of claim 2, wherein the separation of the growth substrate started from the epitaxial layer at a peripheral region of a lower surface of the lower seed layer.

* * * * *